United States Patent
Yashima et al.

(10) Patent No.: US 8,122,390 B2
(45) Date of Patent: Feb. 21, 2012

(54) CHARGED PARTICLE BEAM WRITING APPARATUS, AND APPARATUS AND METHOD FOR CORRECTING DIMENSION ERROR OF PATTERN

(75) Inventors: Jun Yashima, Kanagawa (JP); Takayuki Abe, Kanagawa (JP)

(73) Assignee: NuFlare Technology, Inc., Numazu-shi (JP)

(*) Notice: Subject to any disclaimer, the term of this patent is extended or adjusted under 35 U.S.C. 154(b) by 434 days.

(21) Appl. No.: 12/369,252

(22) Filed: Feb. 11, 2009

(65) Prior Publication Data

US 2009/0200488 A1   Aug. 13, 2009

(30) Foreign Application Priority Data

Feb. 13, 2008   (JP) ................................. 2008-031637

(51) Int. Cl.
*G06F 17/50* (2006.01)
(52) U.S. Cl. ................ 716/53; 716/50; 716/51; 716/52; 716/54; 716/55; 716/56
(58) Field of Classification Search ...................... 716/53
See application file for complete search history.

(56) References Cited

U.S. PATENT DOCUMENTS

| | | | |
|---|---|---|---|
| 2003/0093767 A1* | 5/2003 | Murai et al. ..................... | 716/21 |
| 2006/0286690 A1* | 12/2006 | Cao .................................. | 438/14 |
| 2007/0277145 A1* | 11/2007 | Scaman .......................... | 716/19 |
| 2008/0184190 A1 | 7/2008 | Yashima et al. | |

FOREIGN PATENT DOCUMENTS

| | | |
|---|---|---|
| JP | 2003-43661 | 2/2003 |
| JP | 2004-279950 | 10/2004 |
| JP | 2008-71928 | 3/2008 |

* cited by examiner

*Primary Examiner* — Paul Dinh
*Assistant Examiner* — Bryce Aisaka
(74) *Attorney, Agent, or Firm* — Oblon, Spivak, McClelland, Maier & Neustadt, L.L.P.

(57) ABSTRACT

A charged particle beam writing apparatus which the apparatus includes a first area density calculation unit and a first dimension error calculation unit. The apparatus includes a first dimension calculation unit which calculates a second dimension of a pattern obtained by correcting the first dimension error of the first dimension, a second area density calculation unit which calculates a second area density occupied by the pattern of the second dimension in the predetermined region, a second dimension error calculation unit which calculates a second dimension error caused by the loading effect, a second dimension calculation unit which calculates a third dimension by adding the second dimension error to the second dimension, a judgment unit which judges whether a difference between the first dimension and the third dimension is within a predetermined range, and a writing unit which writes the pattern of the second dimension onto a target workpiece.

10 Claims, 11 Drawing Sheets

CHARGED PARTICLE BEAM WRITING APPARATUS, AND APPARATUS AND METHOD FOR CORRECTING DIMENSION ERROR OF PATTERN

CROSS-REFERENCE TO RELATED APPLICATION

This application is based upon and claims the benefit of priority from the prior Japanese Patent Application No. 2008-031637 filed on Feb. 13, 2008 in Japan, the entire contents of which are incorporated herein by reference.

BACKGROUND OF THE INVENTION

1. Field of the Invention

The present invention relates to a charged particle beam pattern writing apparatus, and an apparatus and method for correcting a dimension error of a pattern. For example, it relates to a method of previously resizing a pattern by using a pattern dimension change amount produced by the loading effect when performing a pattern forming after writing using electron beams, and to an apparatus and method for writing a pattern on a target workpiece by using electron beams on the basis of resized pattern data.

2. Description of Related Art

The lithography technique that advances microscale semiconductor devices is extremely important as being the only process of forming patterns in semiconductor manufacturing processes. In recent years, with high integration of large-scale integrated circuits (LSI), critical dimensions required for semiconductor device circuits are shrinking year by year. In order to form a desired circuit pattern on semiconductor devices, a master pattern (also called a mask or a reticle) of high precision is required. The electron beam writing technique intrinsically having excellent resolution is used for producing such highly precise master patterns.

Figure 11:
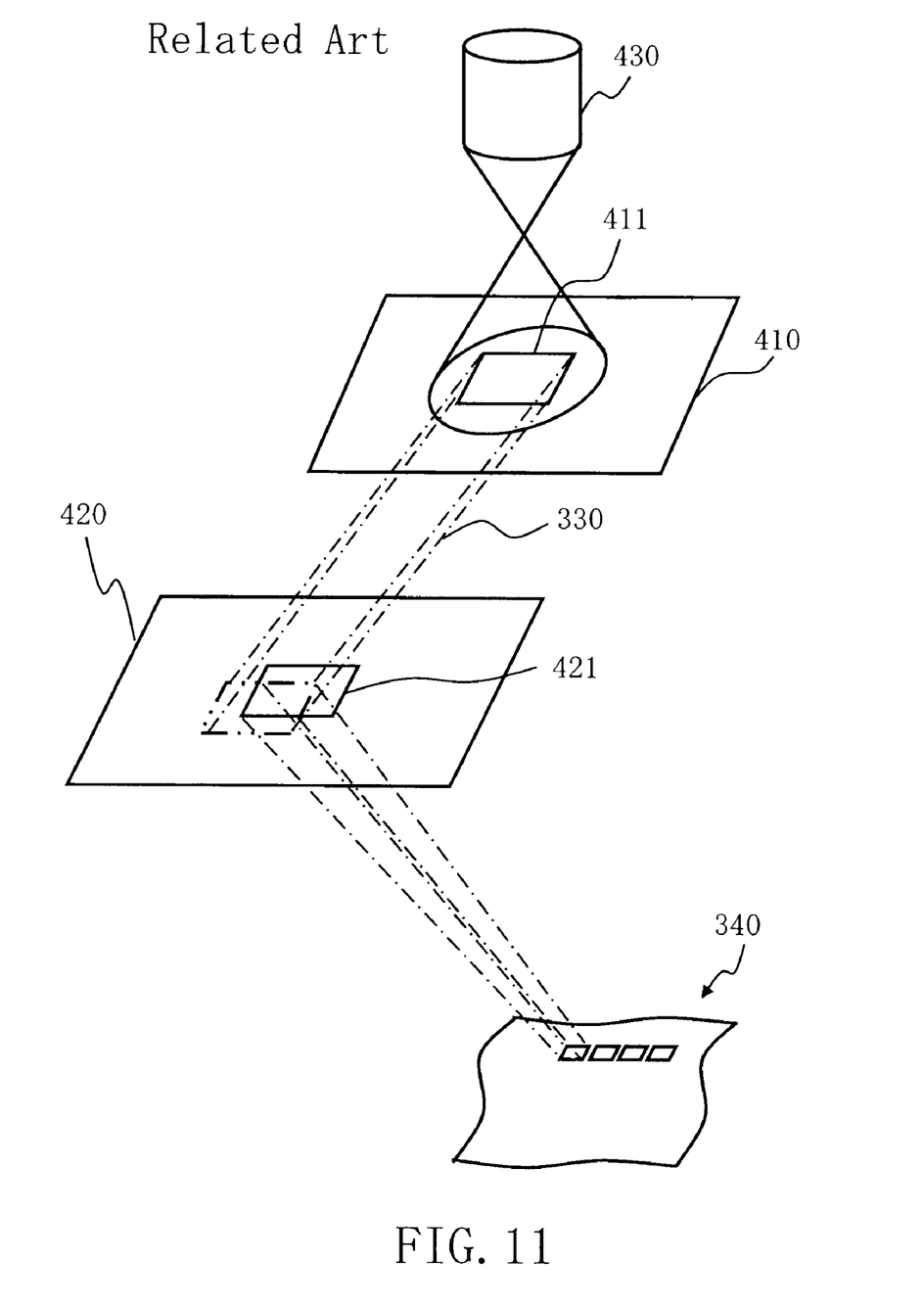
FIG. 11 is a schematic diagram illustrating operations of a variable-shaped electron beam (EB) type writing apparatus.

FIG. 11 is a schematic diagram illustrating operations of a variable-shaped electron beam (EB) type writing apparatus. As shown in the figure, the variable-shaped electron beam writing apparatus, including two aperture plates, operates as follows: A the first aperture plate 410 has a rectangular opening or "hole" 411 for shaping an electron beam 330. This shape of the rectangular opening may also be a square, a rhombus, a rhomboid, etc. A second aperture plate 420 has a variable-shaped opening 421 for shaping the electron beam 330 that passed through the opening 411 into a desired rectangular shape. The electron beam 330 emitted from a charged particle source 430 and having passed through the opening 411 is deflected by a deflector to pass through a part of the variable-shaped opening 421 and thereby to irradiate a target workpiece or "sample" 340 mounted on a stage which continuously moves in one predetermined direction (e.g. X direction) during the writing or "drawing." In other words, a rectangular shape formed as a result of passing through both the opening 411 and the variable-shaped opening 421 is written in the writing region of the target workpiece 340 on the stage. This method of forming a given shape by letting beams pass through both the opening 411 and the variable-shaped opening 421 is referred to as a "variable shaped" method.

In the electron beam writing mentioned above, highly precise uniformity of the line width is required on the surface of a target workpiece, such as a mask surface, when writing a pattern on the target workpiece. However, in the electron beam writing, a phenomenon called a proximity effect occurs when electron beams irradiate a circuit pattern on a mask where resist is applied. The proximity effect is generated by the backward scattering of electron beams penetrating a resist film, reaching the layer thereunder to be reflected, and being incident into the resist film again. As a result, a dimension change occurs, thereby causing a pattern being written in dimension deviated from a desired one. On the other hand, after writing a pattern, when developing the resist film or etching the layer thereunder, a dimension change called a loading effect due to density difference of a circuit pattern occurs.

As the loading effect being a dimension change occurring in a charged particle beam writing represented by an electron beam writing, the following can be cited as examples: a loading effect generated when developing a resist film, a loading effect generated when etching chromium (Cr) serving as a shading film under a resist film, and a loading effect generated when a pattern dimension change is produced by chemical mechanical polishing (CMP). In the electron beam writing, further highly precise uniformity of the line width in a mask surface is required with narrowing the line width of a pattern. Therefore, a loading effect correction to correct the dimension change due to the loading effect is needed. Thus, writing is performed using a dimension obtained by resizing the design line width of a circuit pattern (design pattern) so that a dimension change amount (dimension error) due to a loading effect may be estimated, and thereby a desired design line width can be obtained through the loading effect produced in etching etc. For example, when a calculated dimension change amount caused by the loading effect is positive (direction of the line width becoming wide), the circuit pattern is projected after being resized so that the line width may become narrower than the design line width by the dimension change amount produced by the loading effect.

As to the loading effect correction, it is disclosed that a pattern data correction amount is calculated by adding a loading effect correction amount for correcting a dimension change produced in etching to a process resizing amount for correcting a pattern shape error produced in writing and developing (refer to, e.g., Japanese Patent Application Laid-open (JP-A) No. 2004-279950).

When resizing a pattern in order to correct the loading effect mentioned above, it is essentially necessary to calculate influence of the loading effect based on a pattern after resizing. This is because the sum of the amount of the influence (dimension error) and the dimension of the resized pattern should be in accordance with the design dimension. However, conventionally, influence of the loading effect is calculated based on a pattern before resizing, i.e., a pattern with the design dimension, and resizing is performed by correcting the pattern by the amount of the influence (dimension error). This conventional method can be adequately realized on the premise that the amount of correction is sufficiently small with respect to the pattern before correction and that an error produced in writing with the resized pattern can be disregarded. However, with the recent trend of pattern miniaturization, it is envisaged that such an error could not be neglected.

BRIEF SUMMARY OF THE INVENTION

It is an object of the present invention to provide an apparatus and method by which errors remaining after resizing can be smaller.

In accordance with one aspect of the present invention, a charged particle beam writing apparatus includes a first area density calculation unit configured to calculate a first area density occupied by a pattern of a first dimension in a predetermined region, a first dimension error calculation unit configured to calculate a first dimension error caused by a loading effect, using the first area density, a first dimension calculation unit configured to calculate a second dimension of a pattern obtained by correcting the first dimension error of the first dimension, a second area density calculation unit configured to calculate a second area density occupied by the pattern of the second dimension in the predetermined region, a second dimension error calculation unit configured to calculate a second dimension error caused by the loading effect, using the second area density, a second dimension calculation unit configured to calculate a third dimension by adding the second dimension error to the second dimension, a judgment unit configured to judge whether a difference between the first dimension and the third dimension is within a predetermined range or not, and a writing unit configured to write the pattern of the second dimension in which the difference is within the predetermined range, onto a target workpiece by using a charged particle beam.

In accordance with another aspect of the present invention, an apparatus for correcting a dimension error of a pattern includes a first area density calculation unit configured to calculate a first area density occupied by a pattern of a first dimension in a predetermined region, a first dimension error calculation unit configured to calculate a first dimension error caused by a loading effect, using the first area density, a first dimension calculation unit configured to calculate a second dimension of a pattern obtained by correcting the first dimension error of the first dimension, a second area density calculation unit configured to calculate a second area density occupied by the pattern of the second dimension in the predetermined region, a second dimension error calculation unit configured to calculate a second dimension error caused by the loading effect, using the second area density, a second dimension calculation unit configured to calculate a third dimension by adding the second dimension error to the second dimension, a judgment unit configured to judge whether a difference between the first dimension and the third dimension is within a predetermined range or not, and an output unit configured to output the pattern of the second dimension in which the difference is within the predetermined range.

Moreover, in accordance with another aspect of the present invention, a method for correcting a dimension error of a pattern includes calculating a first area density occupied by a pattern of a first dimension in a predetermined region, calculating a first dimension error caused by a loading effect, using the first area density, calculating a second dimension of a pattern obtained by correcting the first dimension error of the first dimension, calculating a second area density occupied by the pattern of the second dimension in the predetermined region, calculating a second dimension error caused by the loading effect, using the second area density, calculating a third dimension by adding the second dimension error to the second dimension, and judging whether a difference between the first dimension and the third dimension is within a predetermined range or not, to output the pattern of the second dimension when the difference is within the predetermined range.

DETAILED DESCRIPTION OF THE INVENTION

In the following Embodiments, a structure utilizing an electron beam as an example of a charged particle beam will be described. The charged particle beam is not limited to the electron beam. Another charged particle beam, such as an ion beam, may also be used. As an example of a charged particle beam apparatus, a variable shaped type electron beam writing apparatus will be particularly described. While an electron beam pattern writing apparatus will be described hereafter as an example, it is not limited thereto, and also describes a leather mask pattern writing apparatus.

Embodiment 1

Figure 1:
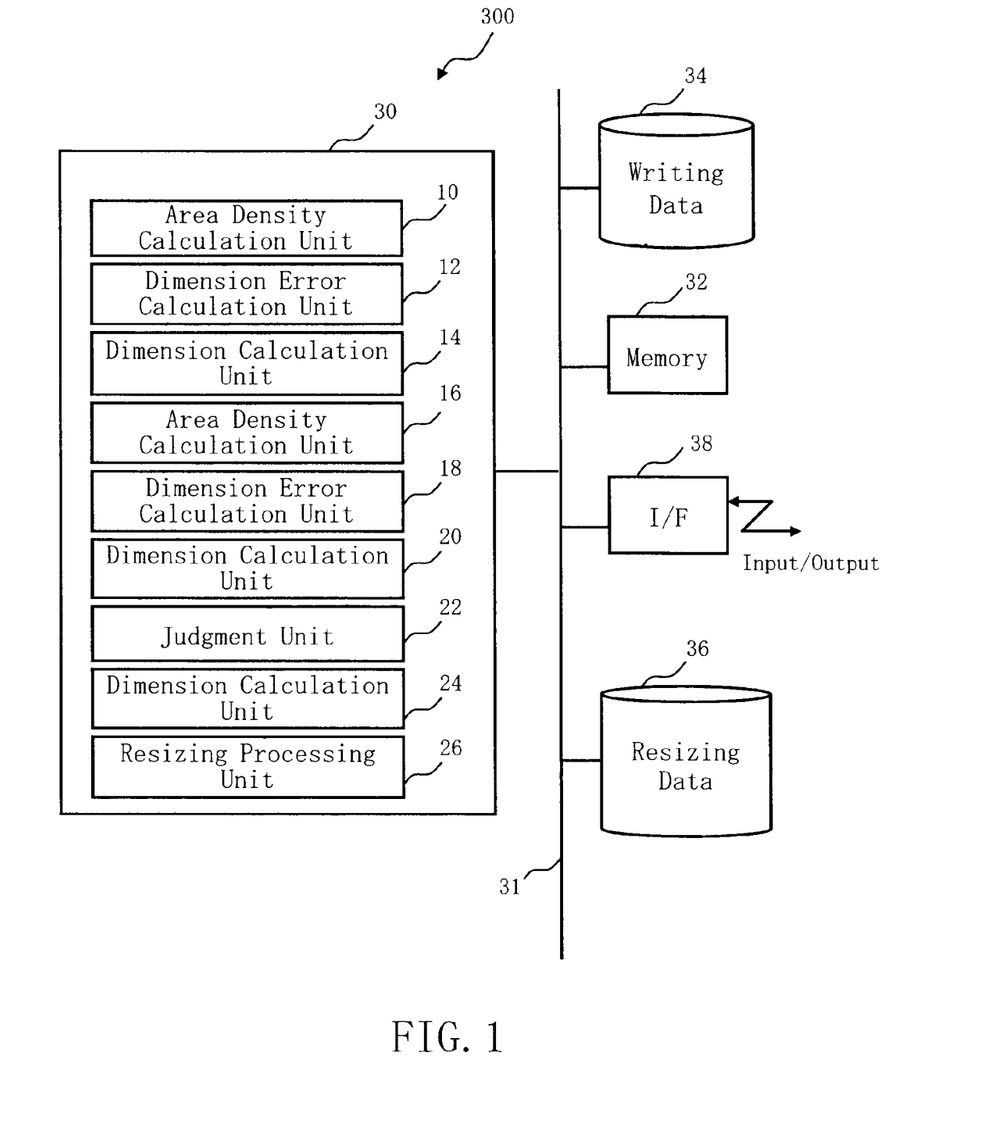
FIG. 1 is a schematic diagram showing the structure of an apparatus for correcting a dimension error of a pattern according to Embodiment 1.

FIG. 1 is a schematic diagram showing the structure of an apparatus for correcting a dimension error of a pattern according to Embodiment 1. In FIG. 1, a resizing apparatus 300 includes a control computer 30, a memory 32, magnetic disk drives 34 and 36, and an interface (I/F) circuit 38. The resizing apparatus 300 is an example of the apparatus for correcting a dimension error of a pattern. The resizing apparatus 300 corrects a dimension error of a pattern defined in writing data to be input into a writing apparatus which writes predetermined patterns onto a target workpiece. The control computer 30, the memory 32, the magnetic disk drives 34 and 36, and the I/F circuit 38 are mutually connected through a bus 31. The control computer 30 has functions, such as area density calculation units 10 and 16, dimension error calculation units 12 and 18, dimension calculation units 14, 20, and 24, a judgment unit 22, and a resizing processing unit 26. In the control computer 30, processing of each function, such as the area density calculation units 10 and 16, the dimension error calculation units 12 and 18, the dimension calculation units 14, 20, and 24, the judgment unit 22, and the resizing processing unit 26 is implemented by software. Alternatively, they may be configured by hardware such as electric circuits. Alternatively, they may be executed by a combination of hardware and software, or a combination of hardware, firmware, and/or software, etc. When implemented by software or a combination of software and hardware etc., data to be input into the control computer 30 or each data being or having been processed is stored in the memory 32 each time. While FIG. 1 shows only the structure elements necessary for explaining Embodiment 1, it should be understood that other structure elements generally necessary for the resizing apparatus 300 may also be included.

When writing with an electron beam, layout of a semiconductor integrated circuit is first designed, and layout data (design data), in which pattern layout is defined, is generated. Then, the layout data is converted in an external conversion device so as to generate writing data which can be input into the pattern writing apparatus mentioned later. The writing data is input into the resizing apparatus 300 through the I/F circuit 38 and stored in the magnetic disk drive 34.

As mentioned above, a phenomenon of dimension change called a loading effect occurs in a charged particle beam writing, such as an electron beam writing. Therefore, it is necessary to resize a pattern defined in writing data by the resizing apparatus 300, before inputting the writing data into the pattern writing apparatus, in order to obtain a desired design line width after affected by the loading effect produced by etching etc.

Figure 2:
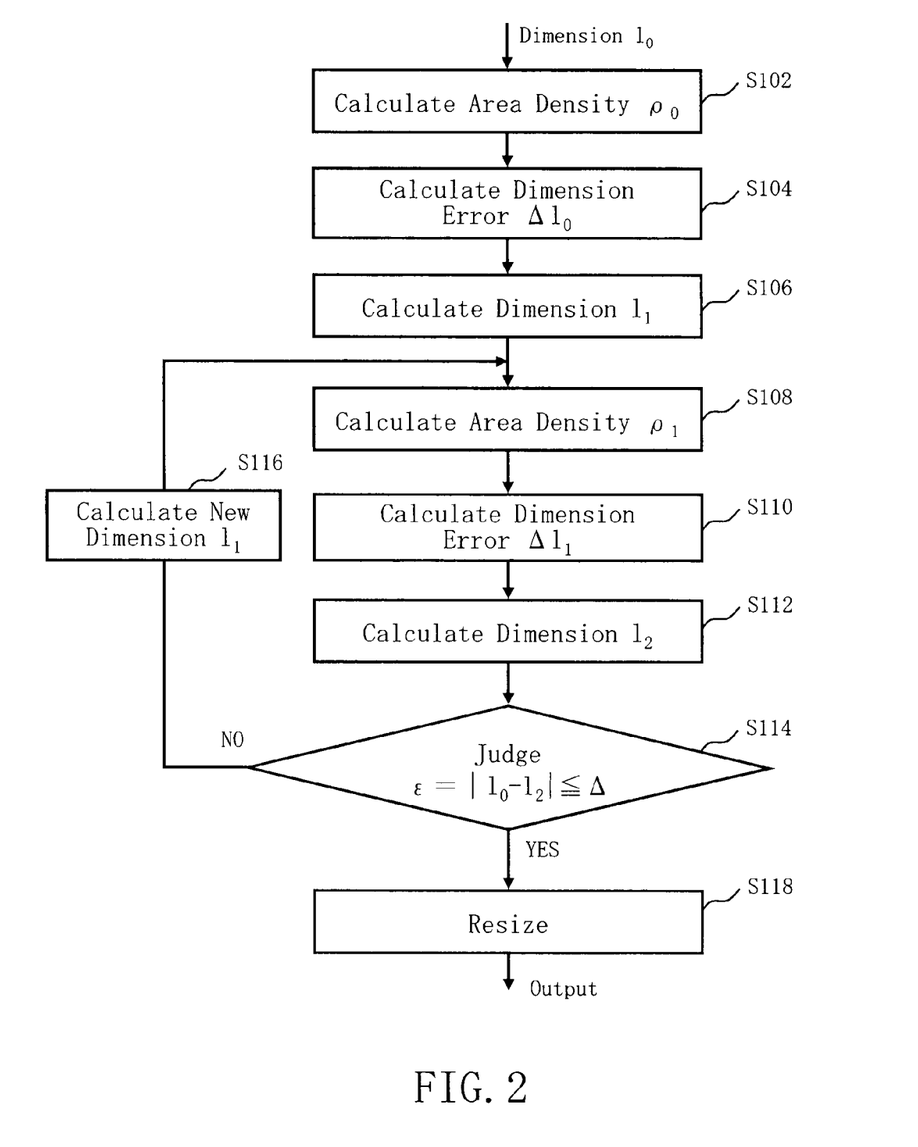
FIG. 2 is a flowchart showing main steps of a method for correcting a dimension error of a pattern according to Embodiment 1.

FIG. 2 is a flowchart showing main steps of a method for correcting a dimension error of a pattern according to Embodiment 1. In FIG. 2, the method executes a series of steps of an area density calculation step (S102), a dimension error calculation step (S104), a dimension calculation step (S106), an area density calculation step (S108), a dimension error calculation step (S110), a dimension calculation step (S112), a judgment step (S114), a new dimension calculation step (S116), and a resizing processing step (S118).

Figure 3:
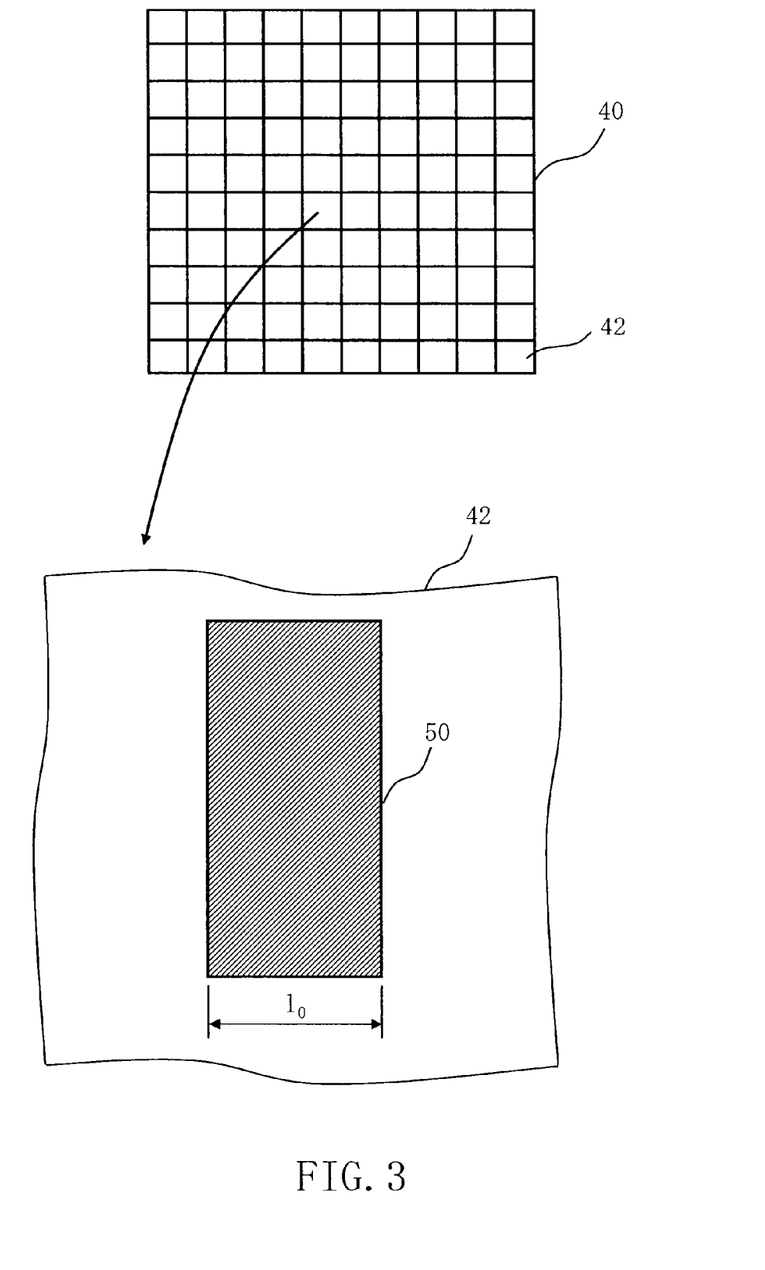
FIG. 3 shows an example of a writing region and a pattern according to Embodiment 1.

In step S102, as an area density calculation step, the area density calculation unit 10 inputs writing data from the magnetic disk drive 34, and virtually divides the writing region into mesh-like regions of a predetermined grid size. FIG. 3 shows an example of a writing region and a pattern according to Embodiment 1. As shown in FIG. 3, the area density calculation unit 10 virtually divides the writing region 40 into a plurality of mesh regions 42. It is preferable to set the mesh size of each mesh region 42 to have a length on the order of μm to mm as a global range, for example 0.5 to 1.0 mm long. FIG. 3 shows the case where a rectangular pattern 50, as an example, is arranged in a certain mesh region 42. While the rectangular pattern 50 is shown in FIG. 3 as an example, it should be understood that the pattern shape is not limited thereto. While only one rectangular pattern 50 is shown in FIG. 3 as an example, it should be understood that a plurality of patterns may be arranged in the mesh region 42. Correcting a dimension error of the pattern 50 will now be described as an example.

For each mesh region 42, the area density calculation unit 10 calculates a first area density $\rho_0$ occupied by the pattern 50 of a first dimension $l_0$ in the mesh region 42 (predetermined region). The first dimension $l_0$ herein is a design dimension before considering a loading effect. The first area density $\rho_0$ is an area density in this design dimension.

In step S104, as a dimension error calculation step, the dimension error calculation unit 12 calculates a first dimension error $\Delta l_0$ caused by the loading effect, based on the first area density $\rho_0$. The dimension error calculation unit 12 serves as an example of the first dimension error calculation unit. The dimension error $\Delta l$ due to the loading effect can be defined by the following equation (1).

$$\Delta l = \rho \gamma \Sigma g(x - x_i) = \rho G \quad (1)$$

$\gamma$ indicates a loading effect correction coefficient, and $g(x)$ indicates a distribution function of a loading effect. For example, it is preferable to use the Gaussian distribution of the influence range (dispersion radius) $\sigma_L$ of the loading effect, as the distribution function $g(x)$.

The dimension error calculation unit 12 calculates the first dimension error $\Delta l_0$ in the first area density $\rho_0$ by using the equation (1) mentioned above.

In step S106, as a dimension calculation step, the dimension calculation unit 14 calculates a second dimension $l_1$ of the pattern by correcting the first dimension error $\Delta l_0$ of the first dimension $l_0$. The dimension calculation unit 14 serves as an example of the first dimension calculation unit. If the line width dimension becomes broader than the first dimension $l_0$, which is the original design dimension, by a dimension error $\Delta l_0$ due to the loading effect, the second dimension $l_1$ can be obtained by correcting the first dimension $l_0$ to be narrower by the dimension error $\Delta l_0$. The second dimension $l_1$ can be calculated by the following equation (2).

$$l_1 = l_0 - \Delta l_0 \quad (2)$$

Figure 4:
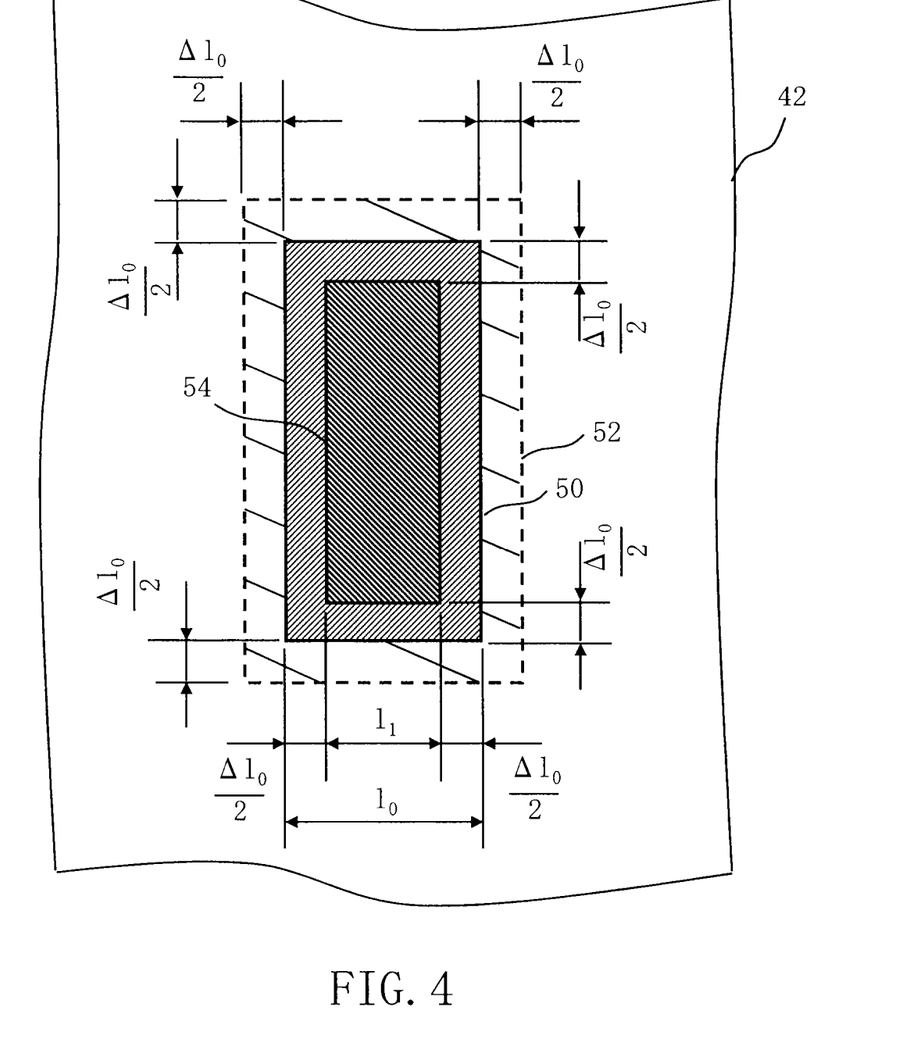
FIG. 4 shows an example of the writing region and the pattern after correction according to Embodiment 1.

FIG. 4 shows an example of the writing region and the pattern after correction according to Embodiment 1. In FIG. 4, the width of the pattern 50 of the design dimension becomes wider by $\Delta l_0/2$ at each side, namely wider by $\Delta l_0$ at both sides, due to the loading effect. Consequently, the pattern 50 becomes wider as shown as a pattern 52. Therefore, by correcting the first dimension $l_0$ of the pattern 50 to be narrower by $\Delta l_0/2$ at each side, namely narrower by $\Delta l_0$ at both sides, a pattern 54 of the second dimension $l_1$ can be obtained.

According to the conventional method, the pattern 54 of the second size $l_1$ is written. However, the amount of dimension change due to the loading effect is dependent upon an area density in actual writing dimension. That is, when writing is performed by using the second dimension $l_1$ which is the dimension after correction, the amount of dimension change due to the loading effect is dependent upon the area density in the second dimension $l_1$. Thus, even when writing is performed by using the pattern 54 of the second dimension $l_1$ in which the first dimension error $\Delta l_0$ based on the area density $\rho_0$ in the first dimension $l_0$ is corrected, an error still remains. In other words, even if the writing is performed by using the pattern 54 of the second dimension $l_1$, the dimension after the dimension change due to the loading effect does not accord with the pattern 50 of the first dimension $l_0$ which is the design dimension. Therefore, the following steps are further performed according to Embodiment 1.

In step S108, as an area density calculation step, the area density calculation unit 16 calculates a second area density $\rho_1$ occupied by the pattern 54 of the second dimension $l_1$ in the mesh region 42. The area density calculation unit 16 serves as an example of a second area density calculation unit.

In step S110, as a dimension error calculation step, the dimension error calculation unit 18 calculates a second dimension error $\Delta l_1$ caused by the loading effect, based on the second area density $\rho_1$. The dimension error calculation unit 18 serves as an example of a second dimension error calculation unit. The calculation method is just to calculate the equation (1), based on the second area density $\rho_1$.

In step S112, as a dimension calculation step, the dimension calculation unit 20 calculates a third dimension $l_2$ by adding the second dimension error $\Delta l_1$ to the second dimension $l_1$. The dimension calculation unit 20 serves as an example of a second dimension calculation unit.

In step S114, as a judgment step, the judgment unit 22 judges whether the difference between the first dimension $l_0$ and the third dimension $l_2$ is within a predetermined range $\Delta$ or not.

As mentioned above, the first dimension error $\Delta l_0$ caused by the loading effect is firstly calculated based on the first area density $\rho_0$ occupied by the pattern of the first dimension $l_0$. In other words, the dimension error $\Delta l_0$ due to the loading effect is calculated based on the pattern before resizing. Then, a second dimension $l_1$ of the pattern is calculated by correcting the first dimension error $\Delta l_0$ of the first dimension $l_0$. In other words, the dimension $l_1$ after resizing is calculated. Furthermore, based on the second area density $\rho_1$ occupied by the pattern of the second dimension $l_1$ in a predetermined region, the second dimension error $\Delta l_1$ caused by the loading effect is calculated. In other words, the dimension error $\Delta l_1$ due to the loading effect is calculated based on the pattern after resizing. Then, the third dimension $l_2$ is calculated by adding the second dimension error $\Delta l_1$ to the second dimension $l_1$. In other words, the dimension to be finally obtained is calculated. Further, it is judged whether the difference between the first dimension $l_0$ and the third dimension $l_2$ is within the predetermined range $\Delta$ or not. By this judgment, it is possible to grasp whether the resized dimension $l_1$, namely the second dimension $l_1$ after resizing, has been calculated with sufficient precision or not.

Figure 5:
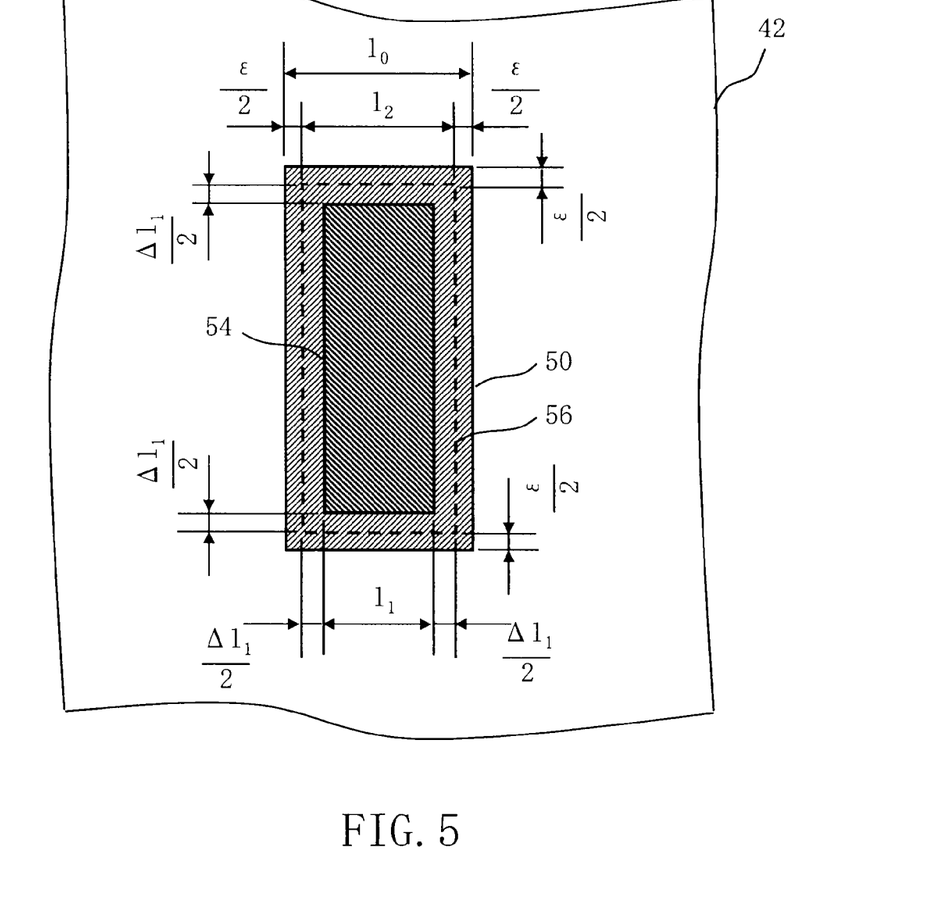
FIG. 5 shows an example of a writing region, patterns before and after correction, and a pattern after a dimension change due to the loading effect produced when writing using the pattern after the correction according to Embodiment 1.

FIG. 5 shows an example of a writing region, patterns before and after correction, and a pattern after a dimension change due to the loading effect produced when writing using the pattern after the correction according to Embodiment 1. In FIG. 5, the width of the pattern 54 of the second dimension $l_1$ becomes wider by $\Delta l_1/2$ at each side, namely wider by $\Delta l_1$ at both sides, due to the loading effect. Therefore, when writing the pattern 54 of the second dimension $l_1$, the width of a pattern 56 (dotted line) which is a pattern after the dimension change due to the loading effect still has an error with respect to the patterns 50 of the first dimension being the design dimension. This error is $\epsilon/2$ at each side, namely $\epsilon$ at both sides. In other words, the difference $\epsilon$ between the first dimension $l_0$ and the third dimension $l_2$ still remains as an error. When the difference $\epsilon$ is equal to or less than the predetermined range $\Delta$, the judgment unit 22 judges the difference $\epsilon$ to be within a tolerance range. Then, when the difference $\epsilon$ is within the predetermined range $\Delta$, it goes to S118. When the difference $\epsilon$ is greater than the predetermined range $\Delta$, it goes to S116. Owing to this judgment processing, the second dimension $l_1$ of a corrected dimension of out of the tolerance range can be excluded.

In step S116, as a new dimension calculation step, when the difference $\epsilon$ is out of the predetermined range $\Delta$, the dimension calculation unit 24 adds the difference $\epsilon$ to the second dimension 11 to obtain a fourth dimension as a new second dimension $l_1$. Then, it goes to S108. The steps from S108 to S116 are repeated until the difference $\epsilon$ falls within the predetermined range $\Delta$. That is, the area density calculation unit 16 calculates a new second area density $\rho_1$ (third area density) occupied by the pattern of a new second dimension $l_1$ in the mesh region 42. Then, the dimension error calculation unit 18 calculates a new second dimension error $\Delta l_1$ (third dimension error) caused by the loading effect, based on the new second area density $\rho_1$. The dimension calculation unit 20 adds the new second dimension error $\Delta l_1$ to the new second dimension $l_1$ to obtain a new third dimension $l_2$ (fifth dimension). The judgment unit 22 judges whether a new difference $\epsilon$ (second difference) between the first dimension $l_0$ and the new third dimension $l_2$ is within the predetermined range $\Delta$ or not. When the new difference $\epsilon$ is out of the predetermined range, the new dimension calculation unit 24 adds the new difference $\epsilon$ to the new second dimension $l_1$ to obtain a new fourth dimension as a newer second dimension $l_1$. Then, it goes to S108.

Figure 6:
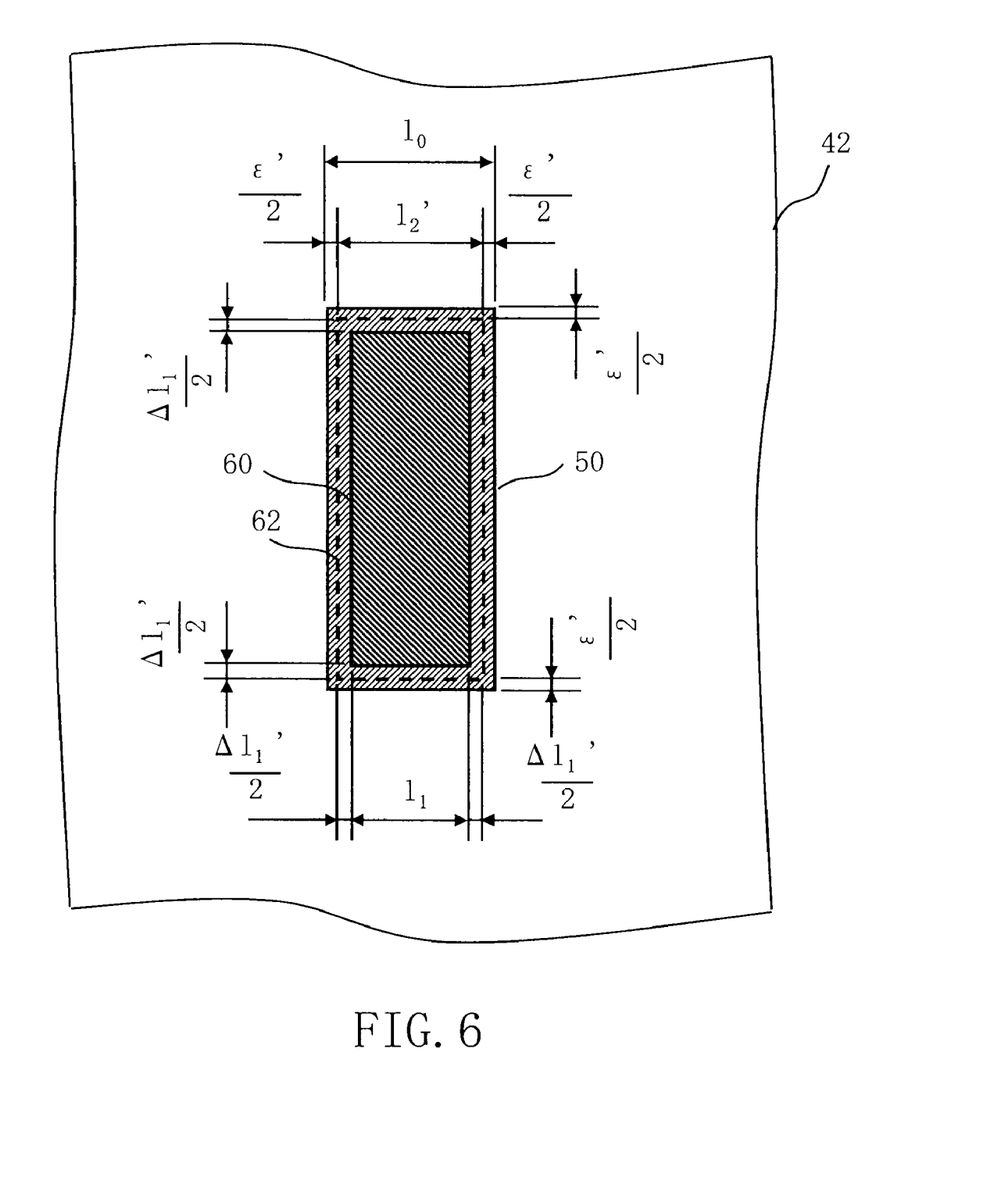
FIG. 6 shows an example of a writing region, patterns before and after correction after performing repeated calculations, and a pattern after a dimension change due to the loading effect produced when writing using the pattern after the correction according to Embodiment 1.

FIG. 6 shows an example of a writing region, patterns before and after correction after performing repeated calculations, and a pattern after a dimension change due to the loading effect produced when writing using the pattern after the correction according to Embodiment 1. In FIG. 6, the new second dimension $l_1$ (fourth dimension) is denoted by $l_1'$. The new third dimension $l_2$ (fifth dimension) is denoted by $l_2'$. The new second dimension error $\Delta l_1$ (third dimension error) is denoted by $\Delta l_1'$. The new difference $\epsilon$ (second difference) is denoted by $\epsilon'$. The width of a pattern 60 of the new second dimension $l_1'$ becomes wider by $\Delta l_1'/2$ at each side, namely wider by $\Delta l_1'$ at both sides, due to the loading effect. Therefore, when writing the pattern 60 of the new second dimension $l_1'$, the width of a pattern 62 (dotted line) which is a pattern after the dimension change due to the loading effect still has an error with respect to the patterns 50 of the first dimension $l_0$ being the design dimension. This error is $\epsilon'/2$ at each side, namely $\epsilon'$ at both sides. In other words, the difference $\epsilon'$ between the first dimension $l_0$ and the new third dimension $l_2'$ still remains as an error. When the difference $\epsilon'$ is equal to or less than the predetermined range $\Delta$, the judgment unit 22 judges the difference $\epsilon'$ to be within a tolerance range. Then, when the difference $\epsilon'$ is within the predetermined range $\Delta$, it goes to S118. When the difference $\epsilon'$ is greater than the predetermined range $\Delta$, it goes to S116.

As mentioned above, by repeating the steps from S108 to S116, the pattern 62 which is a pattern after the dimension change due to the loading effect can be closer to the pattern 50 of the first dimension $l_0$ being the design dimension. This repeating step needs to be repeated until the difference $\epsilon$ (or $\epsilon'$) falls within the tolerance range.

In step S118, as a resizing processing step, the resizing processing unit 26 resizes the pattern 50 of the first dimension $l_0$ being the design dimension, to the second dimension $l_1$ whose difference $\epsilon$ is within the predetermined range $\Delta$. The resizing processing unit 26 outputs writing data of the pattern which has been resized to the second dimension $l_1$, to the magnetic disk drive 36. The resizing processing unit 26 serves as an example of the output unit. The magnetic disk drive 36 stores the writing data after the resizing. Moreover, the writing data after resizing is output to the pattern writing apparatus through the I/F circuit 38.

As mentioned above, the dimension change amount due to the loading effect can be calculated based on the area density after correction. Thus, high precision correction of the dimension can be achieved by repeatedly calculating the correction dimension, meaning a dimension to be corrected, until the difference with respect to the design dimension falls within the tolerance range. Consequently, it is possible to generate a writing pattern whose dimension has been further highly precisely resized.

Now, two cases calculated using this method are described below.

[Case 1]

As a desired design pattern, it is assumed that there is arranged a line and space pattern of 1:1 with a line width of 500 nm in a mesh region, where the first dimension $l_0$ is 500 nm and the first area density $\rho_0$ is 50%. Moreover, it is assumed that G=20 nm in the equation (1). In this case, the first dimension error $\Delta l_0$ is calculated by using the equation (1) as follows:

$$\Delta l_0 = 0.5 \times 20 = 10 \text{ nm}$$

Next, the second dimension $l_1$ is calculated by using the equation (2) as follows:

$$l_1 = 500 - 10 = 490 \text{ nm}$$

Therefore, the second area density $\rho_1$ becomes 49%. Thus, the second dimension error $\Delta l_1$ is $\Delta l_1 = 0.49 \times 20 = 9.8$ nm. Then, the third dimension $l_2$ is $l_2 = 490 + 9.8 = 499.8$ nm. Therefore, the difference $\epsilon$ is $\epsilon = 500 - 499.8 = 0.2$ nm. For example, if the tolerance range $\Delta$ is $\pm 1$ nm, since the difference $\epsilon$ is within the tolerance range $\Delta$, the calculation of dimension resizing because of the loading effect is completed by performing each calculation once. In this case, the pattern dimension after resizing is to be the second dimension $l_1 = 490$ nm.

[Case 2]

As a desired design pattern, it is assumed that there is arranged a line and space pattern of 1:1 with a line width of 50 nm, being smaller by one digit than that of case 1, in a mesh region, where the first dimension $l_0$ is 50 nm and the first area density $\rho_0$ is 50%. Moreover, similar to the case 1, it is assumed that G=20 nm in the equation (1). In this case, the first dimension error $\Delta l_0$ is calculated by using the equation (1) as follows:

$$\Delta l_0 = 0.5 \times 20 = 10 \text{ nm}$$

Next, the second dimension $l_1$ is calculated by using the equation (2) as follows:

$$l_1 = 50 - 10 = 40 \text{ nm}$$

Therefore, the second area density $\rho_1$ becomes 40%. Thus, the second dimension error $\Delta l_1$ is $\Delta l_1 = 0.4 \times 20 = 8$ nm. Then, the third dimension $l_2$ is $l_2 = 40 + 8 = 48$ nm. Therefore, the difference $\epsilon$ is $\epsilon = 50 - 48 = 2$ nm. If the tolerance range $\Delta$ is $\pm 1$ nm as mentioned above, the difference $\epsilon$ is not within the tolerance range $\Delta$. That is, the calculation of dimension resizing because of the loading effect has not been thoroughly achieved by performing each calculation once. Then, the repeated calculations described above are executed.

First, the second dimension $l_1$ in the second time is $l_1 = 40 + 2 = 42$ nm. Therefore, the second area density $\rho_1$ in the second time is 42%. Thus, the second dimension error $\Delta l_1$ in the second time is $\Delta l_1 = 0.42 \times 20 = 8.4$ nm. Therefore, the third dimension $l_2$ in the second time is $l_2 = 42 + 8.4 = 50.4$ nm. That is, the difference $\epsilon$ is $\epsilon = 50 - 50.4 = -0.4$ nm. Thus, the difference $\epsilon$ is within the tolerance range $\Delta$. By repeating the calculation processing once, it becomes possible to highly precisely perform the calculation of dimension resizing which corrects the dimension change resulting from the loading effect. In this case, the pattern dimension after resizing is to be the second dimension $l_1 = 42$ nm.

As mentioned above, by performing the calculation processing according to Embodiment 1, it is possible to highly precisely correct the pattern dimension, thereby correcting the dimension change resulting from the loading effect. The calculation method of Embodiment 1 becomes effective particularly as the pattern miniaturization progresses.

Embodiment 2

While a dimension error of a pattern defined in writing data is corrected in the off-line state before inputting the writing data into the writing apparatus in Embodiment 1, a dimension error of a pattern defined in writing data is corrected in the writing apparatus after inputting the writing data into the writing apparatus according to Embodiment 2.

Figure 7:
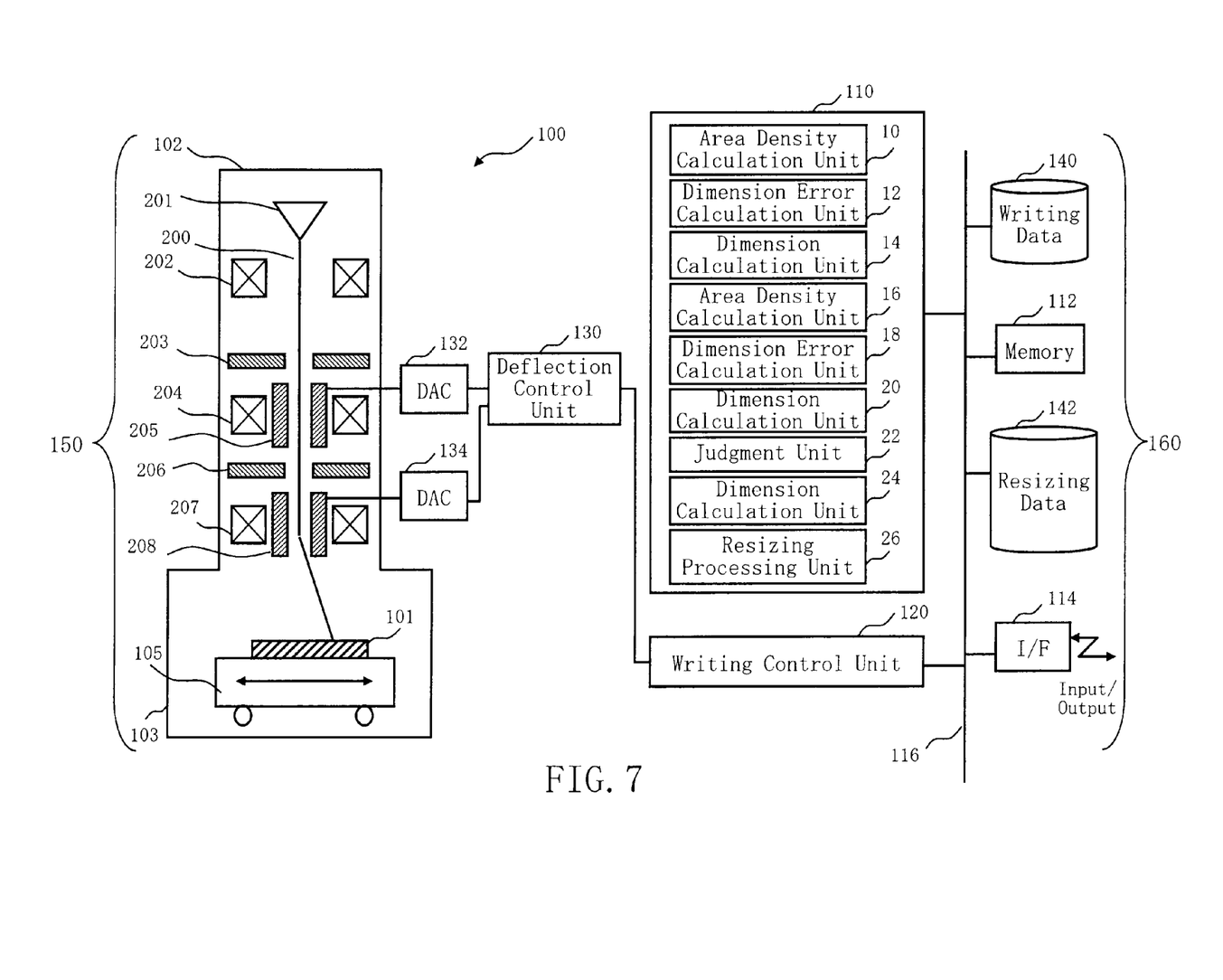
FIG. 7 is a schematic diagram showing the structure of a pattern writing apparatus according to Embodiment 2.

FIG. 7 is a schematic diagram showing the structure of a pattern writing apparatus according to Embodiment 2. A pattern writing apparatus 100 in FIG. 7 includes a writing unit 150 and a control unit 160. The pattern writing apparatus 100 is an example of a charged particle beam writing apparatus. The pattern writing apparatus 100 writes a predetermined pattern on a target workpiece 101. The writing unit 150 includes a writing chamber 103 and an electron lens barrel 102 arranged at the upper part of the writing chamber 103. In the electron lens barrel 102, there are an electron gun assembly 201, an illumination lens 202, a first aperture plate 203, a projection lens 204, a deflector 205, a second aperture plate 206, an objective lens 207, and a deflector 208. In the writing chamber 103, there is arranged an XY stage 105, on which the target workpiece 101 serving as a writing object is placed. The target workpiece 101 is, for example, a mask for exposing or "transferring and printing" a pattern onto a wafer forming a semiconductor device. Such a mask may be a mask blank where no patterns are formed, for example. The control unit 160 includes a control computer 110, a memory 112, magnetic disk drives 140 and 142, a writing control unit 120, a deflection control circuit 130, digital-to-analog converters (DAC) 132 and 134, and an interface (I/F) circuit 114. The control computer 110, the memory 112, the magnetic disk drives 140 and 142, the writing control unit 120, and the interface (I/F) circuit 114 are mutually connected through a bus 116. Similarly to the control computer 30 of FIG. 1, the control computer 110 has functions, such as the area density calculation units 10 and 16, the dimension error calculation units 12 and 18, the dimension calculation units 14, 20, and 24, the judgment unit 22, and the resizing processing unit 26. In the control computer 110, processing of each function, such as the area density calculation units 10 and 16, the dimension error calculation units 12 and 18, the dimension calculation units 14, 20, and 24, the judgment unit 22, and the resizing processing unit 26 is implemented by software. Alternatively, they may be configured by hardware such as electric circuits. Alternatively, they may be executed by a combination of hardware and software, or a combination of hardware, firmware, and/or software, etc. When implemented by software or a combination of software and hardware etc., data to be input into the control computer 110 or each data being or having been processed is stored in the memory 112 each time. While FIG. 7 shows only the structure elements necessary for explaining Embodiment 2, it should be understood that other structure elements generally necessary for the writing apparatus 100 may also be included.

As described above, when writing with an electron beam, layout of a semiconductor integrated circuit is first designed, and layout data (design data), in which pattern layout is defined, is generated. Then, the layout data is converted in an external conversion device so as to generate writing data which can be input into the pattern writing apparatus 100. The writing data for writing a predetermined pattern onto the target workpiece 101 is input in the pattern writing apparatus 100 through the I/F circuit 114 and stored in the magnetic disk drive 140 serving as an example of a storage unit.

Figure 8:
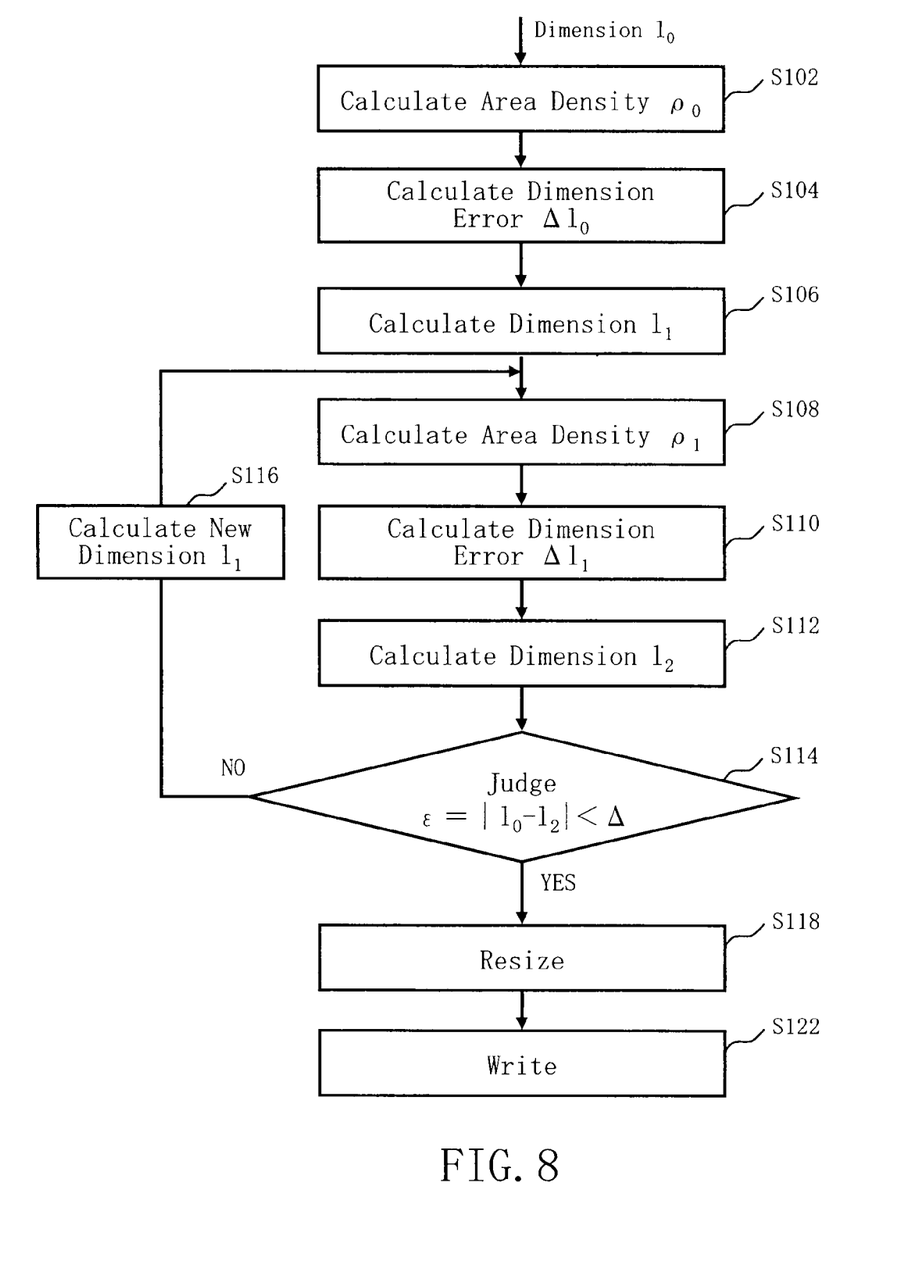
FIG. 8 is a flowchart showing main steps of a method for correcting a dimension error of a pattern according to Embodiment 2.

FIG. 8 is a flowchart showing main steps of a method for correcting a dimension error of a pattern according to Embodiment 2. In FIG. 8, the writing method according to Embodiment 2 executes a series of steps of the area density calculation step (S102), the dimension error calculation step (S104), the dimension calculation step (S106), the area density calculation step (S108) the dimension error calculation step (S110), the dimension calculation step (S112), the judgment step (S114), the new dimension calculation step (S116), the resizing processing step (S118), and a writing step (S122). The steps from the area density calculation step (S102) to the resizing processing step (S118) are the same as those in FIG. 2. That is, the method for correcting a dimension error of a pattern according to Embodiment 2 executes a series of the steps from the area density calculation step (S102) to the resizing processing step (S118). The processing contents of each step from the area density calculation step (S102) to the resizing processing step (S118) is the same as that in Embodiment 1. However, it should be understood that the control computer 30 is to be read as the control computer 110, the memory 32 to be as the memory 112, the magnetic disk drive 34 to be as the magnetic disk drive 140, the magnetic disk drive 36 to be as the magnetic disk drive 142, and the I/F circuit 36 to be as the I/F circuit 114.

The writing data after resizing, which has been resized using the second dimension $l_1$ obtained by repeatedly calculating the correction dimension by the control computer 110 until the difference between the correction dimension and the design dimension falls within the tolerance range Δ, is stored in the magnetic disk drive 142.

In step S122, as a writing step, the writing control unit 120 reads the writing data, in which the dimension change due to the loading effect has been corrected, from the magnetic disk drive 142. After conversion in several steps for the pattern data defined in the input writing data, it is generated as shot data. Then, the shot data is output to the deflection control circuit 130. The deflection control circuit 130 outputs a digital signal indicating an amount of deflection to the deflector 208, for example. The digital signal is converted into an analog signal in the DAC 134, to be a deflection voltage to be applied to the deflector 208. Moreover, the deflection control circuit 130 outputs a digital signal indicating an amount of deflection to the deflector 205, for example. The digital signal is converted into an analog signal in the DAC 132, to be a deflection voltage to be applied to the deflector 205. Then, the writing unit 150 writes a pattern of the second dimension $l_1$ whose difference ε is, by resizing, within the tolerance range Δ, onto the target workpiece 101 by using an electron beam 200. The writing unit 150 operates as follows:

The electron beam 200 emitted from the electron gun assembly 201 irradiates the entire first aperture 203 having an opening in the shape of a rectangle by the illumination lens 202. At this point, the electron beam 200 is shaped to be a rectangle. Such a rectangular shape may be a square, rhombus, rhomboid, etc. Then, after having passed through the opening of the first aperture 203, the electron beam 200 of a first aperture image is projected onto the second aperture 206 by the projection lens 204. The position of the first aperture image on the second aperture 206 is deflection-controlled by the deflector 205, so as to change the shape and size of the beam. After having passed through the opening of the second aperture 206, the electron beam 200 of a second aperture image is focused by the objective lens 207 and deflected by the deflector 208 which is controlled by the deflection control circuit 130, to reach a desired position on the target workpiece 101 placed on the XY stage 105 which moves continuously.

As mentioned above, according to Embodiment 2, the dimension change amount due to the loading effect can be calculated based on the area density after correction. Thus, high precision correction of the dimension can be achieved by repeatedly calculating the correction dimension until the difference with respect to the design dimension falls within the tolerance range Δ. Consequently, it is possible to write a pattern whose dimension has been further highly precisely resized. Moreover, since the resizing for correcting the loading effect is performed in the writing apparatus 100, data processing can be performed in real time while performing subsequent several conversion steps. Thus, it is possible to further reduce the entire writing time, compared with the case of preliminarily performing resizing for correcting a loading effect, at the outside, and then transmitting the writing data to the writing apparatus 100.

Embodiment 3

While data conversion is implemented after resizing a pattern dimension defined in writing data in Embodiment 2, the method of dimension correction is not limited thereto. According to Embodiment 3, there will be described a structure in which a dimension error due to a loading effect is corrected by adjusting an amount of irradiation.

Figure 9:
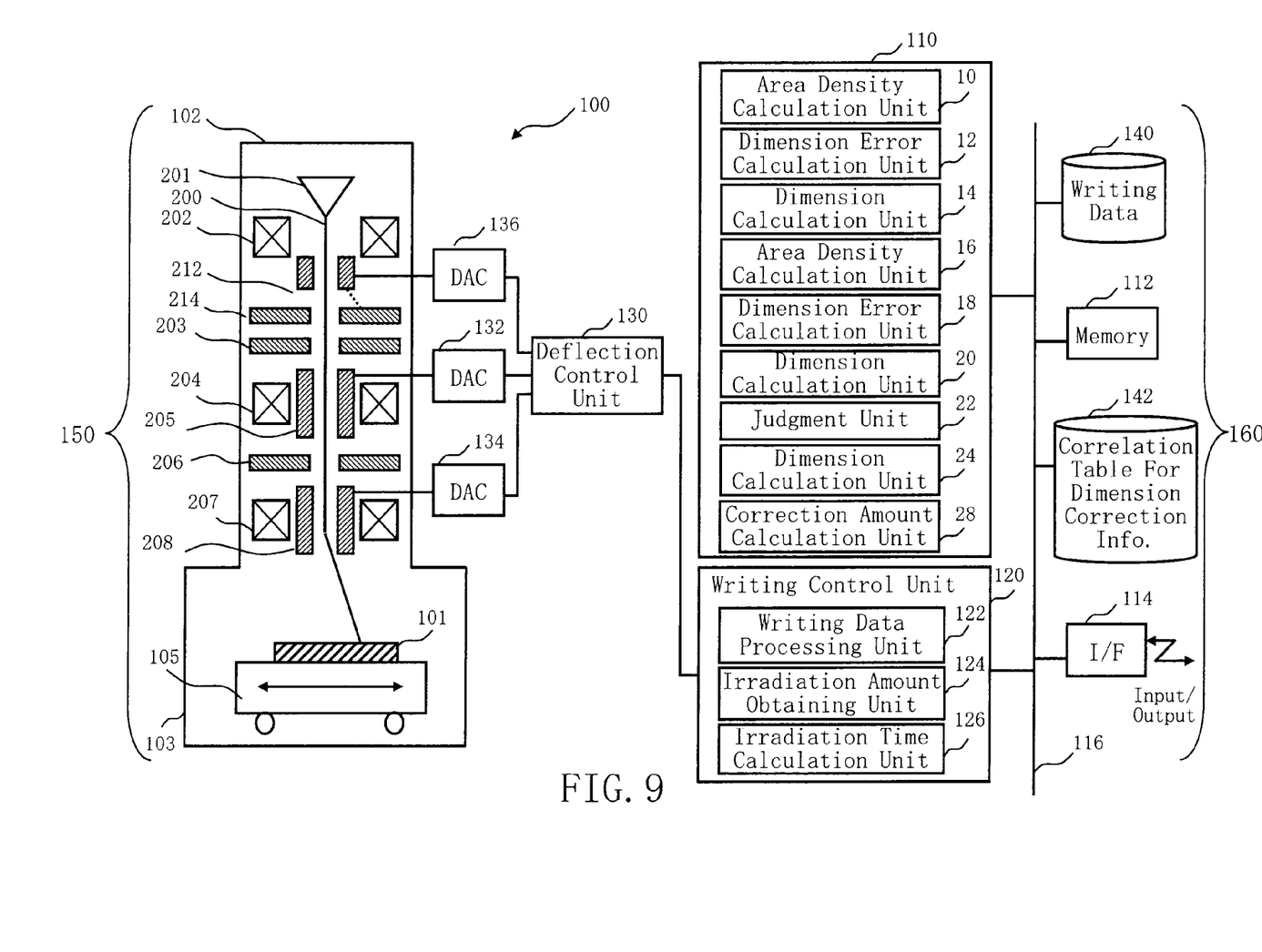
FIG. 9 is a schematic diagram showing the structure of a pattern writing apparatus according to Embodiment 3.

FIG. 9 is a schematic diagram showing the structure of a pattern writing apparatus according to Embodiment 3. FIG. 9 is similar to FIG. 7 except for the addition of a blanking (BLK) deflector 212 and a BLK aperture 214 in the electron lens barrel 102, the addition of a DAC 136 as a structure element of the control unit 160, the addition of a dimension correction amount calculation unit 28 instead of the resizing processing unit 26 in the control computer 110, and the addition of a writing data processing unit 122, an irradiation amount obtaining unit 124, and an irradiation time calculation unit 126 in the writing control unit 120. Moreover, in the magnetic disk drive 142, a correlation table in which a dimension correction amount for correcting a loading effect and an irradiation amount are related is stored.

Similarly to the control computer 30, the control computer 110 has functions, such as the area density calculation units 10 and 16, the dimension error calculation units 12 and 18, the dimension calculation units 14, 20, and 24, the judgment unit 22, and the dimension correction amount calculation unit 28. In the control computer 110, processing of each function, such as the area density calculation units 10 and 16, the dimension error calculation units 12 and 18, the dimension calculation units 14, 20, and 24, the judgment unit 22, and the dimension correction amount calculation unit 28 is implemented by software. Alternatively, they may be configured by hardware such as electric circuits. Alternatively, they may be executed by a combination of hardware and software, or a combination of hardware, firmware and/or software, etc. When implemented by software or a combination of software and hardware etc., data to be input into the control computer 110 or each data being or having been processed is stored in the memory 112 each time.

In the writing control unit 120, processing of each function, such as the writing data processing unit 122, the irradiation amount obtaining unit 124, and the irradiation time calculation unit 126 is implemented by software. Alternatively, they may be configured by hardware such as electric circuits. Alternatively, they may be executed by a combination of hardware and software, or a combination of hardware, firmware, and/or software. When implemented by software or a combination of software and hardware etc., data to be input into the writing control computer 120 or each data being or having been processed is stored in a memory not shown each time.

While FIG. 9 shows only the structure elements necessary for explaining Embodiment 3, it should be understood that other structure elements generally necessary for the writing apparatus 100 may also be included.

Figure 10:
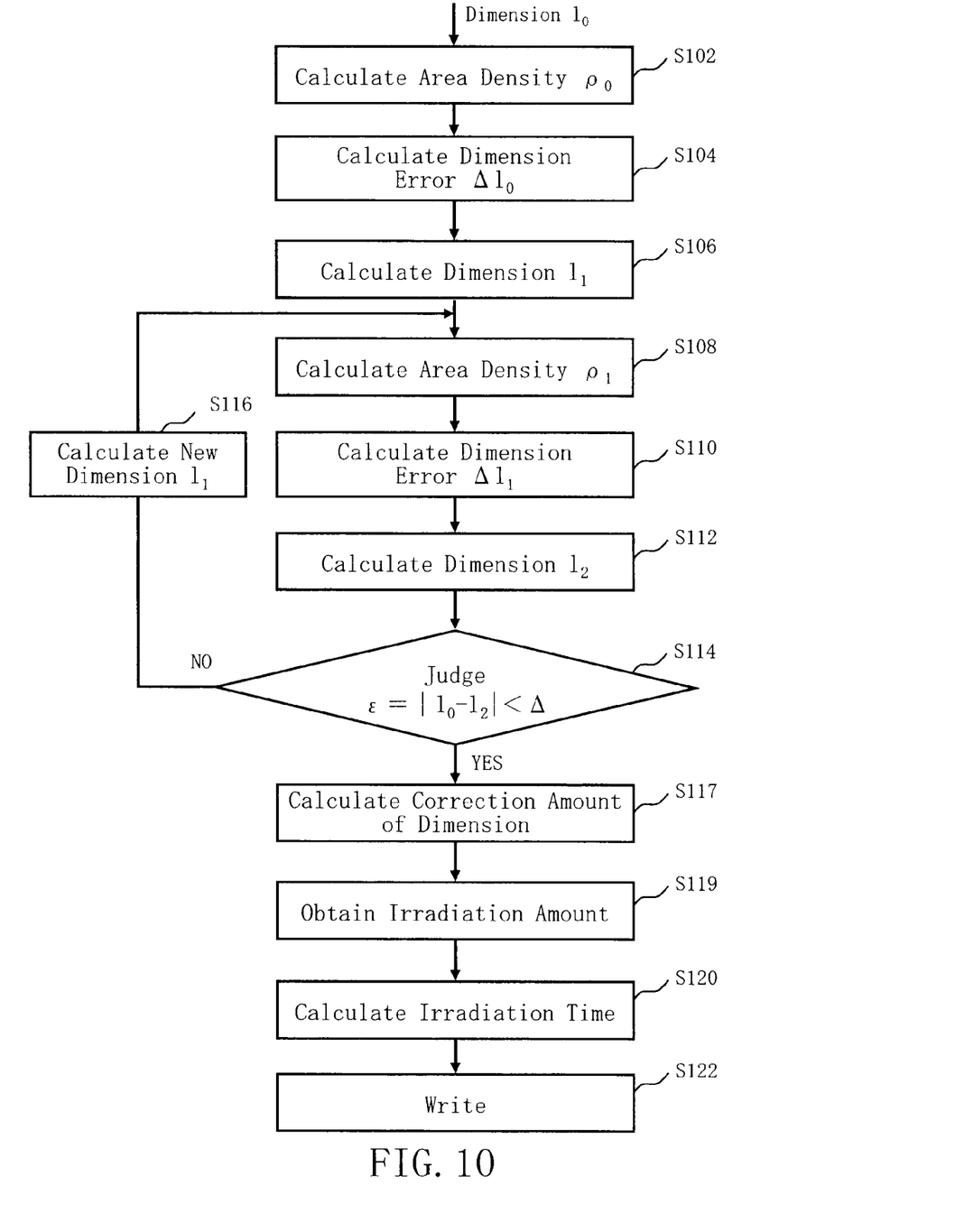
FIG. 10 is a flowchart showing main steps of a method for correcting a dimension error of a pattern according to Embodiment 3.

FIG. 10 is a flowchart showing main steps of a method for correcting a dimension error of a pattern according to Embodiment 3. In FIG. 10, the writing method according to Embodiment 3 executes a series of steps of the area density calculation step (S102), the dimension error calculation step (S104), the dimension calculation step (S106), the area density calculation step (S108), the dimension error calculation step (S110), the dimension calculation step (S112), the judgment step (S114), the new dimension calculation step (S116), a dimension correction amount calculation step (S117), an irradiation amount obtaining step (S119), an irradiation time calculation step (S120) and the writing step (S122). The steps from the area density calculation step (S102) to the new dimension calculation step (S116) are the same as those in FIG. 2. Moreover, FIG. 10 is similar to FIG. 8 except for the addition of the dimension correction amount calculation step (S117), the irradiation amount obtaining step (S119), and the irradiation time calculation step (S120) instead of the resizing processing step (S118).

As described above, in the steps from the dimension calculation step (S106) to the new dimension calculation step (S116), a correction dimension is repeatedly calculated until the difference between the first dimension $l_0$ being the design dimension and the third dimension $l_2$ falls within the tolerance range $\Delta$. Thereby, the final second dimension $l_1$ can be obtained.

In step S117, as a dimension correction amount calculation step, the dimension correction amount calculation unit 28 calculates a difference between the first dimension $l_0$ being the design dimension and the final second dimension $l_1$. This difference serves as an amount of dimension correction. Then, the calculated dimension correction amount is stored in the magnetic disk drive 142. According to Embodiment 3, based on this calculated dimension correction amount, the dimension of a pattern is corrected by adjusting the amount of irradiation of the electron beam 200.

The writing control unit 120 first reads the writing data from the magnetic disk drive 140. After the writing data processing unit 122 performs conversion in several steps for the pattern data defined in the input writing data, it is generated as shot data. Moreover, in addition to this conversion processing, calculation for correcting the dimension change resulting from the loading effect is performed as described in the following steps.

In step S119, as an irradiation amount obtaining step, the irradiation amount obtaining unit 124, for each mesh region, reads a calculated dimension correction amount from the magnetic disk drive 142, and obtains an irradiation amount D (x, y) which is used for writing the pattern of the corrected dimension obtained by correcting the design dimension of the pattern by the read dimension correction amount. That is, specifically, the irradiation amount obtaining unit 124 reads the correlation table from the magnetic disk drive 142 and obtains the irradiation amount which is used for writing the pattern of the corrected dimension obtained by correcting the design dimension of the pattern by the obtained dimension correction amount.

In step S120, as an irradiation time calculation step, the irradiation time calculation unit 126, for each mesh region, calculates an irradiation time t (irradiation amount D(x, y)/current density J) by using the obtained irradiation amount D (x, y) and a current density J which has been set.

In step S122, as a writing step, the writing control unit 120 outputs a signal to the deflection control circuit 130 so that the beam irradiation onto the target workpiece 101 may be turned off at the time of the calculated irradiation time t has passed. In the deflection control circuit 130, the BLK deflector 212 is controlled through the DAC 136 so that the electron beam 200 may be deflected according to the calculated irradiation time t, based on the signal. After irradiating the target workpiece 101 with a desired irradiation amount D (x, y), the electron beam 200 deflected by the BLK deflector 212 is blocked off by the BLK aperture 214 so that the beam may not reach the target workpiece 101. Thus, the writing unit 150 irradiates the target workpiece 101 with the electron beam 200 of the irradiation amount D (x, y) used for writing the pattern of the corrected dimension obtained by correcting the design pattern by the dimension correction amount. Meanwhile, the shot dimension and the shot position of the design dimension are controlled as follows:

The electron beam 200 emitted from the electron gun assembly 201 and having passed the BLK aperture 214 irradiates the entire first aperture 203 which has an opening in the shape of a rectangle, by the illumination lens 202. At this point, the electron beam 200 is shaped to be a square. Then, after having passed through the opening of the first aperture 203, the electron beam 200 of a first aperture image is projected onto the second aperture 206 by the projection lens 204. The position of the first aperture image on the second aperture 206 is controlled by the deflector 205 so as to change the shape and size of the beam. After having passed through the opening of the second aperture 206, the electron beam 200 of a second aperture image is focused by the objective lens 207 and deflected by the deflector 208 to reach a desired position on the target workpiece 101 placed on the movable XY stage 105. Thus, by correcting the amount of irradiation as mentioned above, the writing unit 150 writes the pattern of the second dimension $l_1$ whose difference $\epsilon$ is within the tolerance range $\Delta$, onto the target workpiece 101 by using the electron beam 200.

Similarly to Embodiment 2, as described above, the dimension change amount due to the loading effect can be calculated based on the area density after correction according to Embodiment 3. A highly precise amount of dimension correction can be obtained by repeatedly calculating the correction dimension until the difference with respect to the design dimension falls within the tolerance range $\Delta$. Consequently, it is possible to write a pattern whose dimension has been highly precisely corrected by adjusting the irradiation amount.

While the embodiments have been described above with reference to specific examples, the present invention is not limited to these specific ones.

While description of the apparatus structure, control method, etc. not directly required for explaining the present invention is omitted, some or all of them may be suitably selected and used when needed. For example, although the structure of the control unit for controlling the writing apparatus 100 is not described, it should be understood that a necessary control unit structure is to be selected and used appropriately.

In addition, any other writing apparatus using a charged particle beam, and an apparatus and method for correcting a pattern dimension error that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
   a first area density calculation unit configured to calculate a first area density occupied by a pattern of a first dimension in a predetermined region;
   a first dimension error calculation unit configured to calculate a first dimension error caused by a loading effect, using the first area density;
   a first dimension calculation unit configured to calculate a second dimension of a pattern obtained by correcting the first dimension error of the first dimension;
   a second area density calculation unit configured to calculate a second area density occupied by the pattern of the second dimension in the predetermined region;

a second dimension error calculation unit configured to calculate a second dimension error caused by the loading effect, using the second area density;

a second dimension calculation unit configured to calculate a third dimension by adding the second dimension error to the second dimension;

a judgment unit configured to judge whether a difference between the first dimension and the third dimension is within a predetermined range or not; and a writing unit configured to write the pattern of the second dimension in which the difference is within the predetermined range, onto a target workpiece by using a charged particle beam.

2. The apparatus according to claim 1 further comprising:
a third dimension calculation unit configured to calculate a fourth dimension, as a new second dimension, by adding the difference to the second dimension.

3. The apparatus according to claim 2, wherein the second area density calculation unit, the second dimension error calculation unit, and the second dimension calculation unit repeat each calculation until the difference is within the predetermined range.

4. The apparatus according to claim 1, wherein writing is performed based on data of the pattern of the second dimension, in which the difference is within the predetermined range, obtained by resizing the pattern of the first dimension.

5. The apparatus according to claim 1, wherein an irradiation amount of the charged particle beam is adjusted so that the pattern of the first dimension becomes the pattern of the second dimension in which the difference is within the predetermined range.

6. An apparatus for correcting a dimension error of a pattern comprising:
a first area density calculation unit configured to calculate a first area density occupied by a pattern of a first dimension in a predetermined region;
a first dimension error calculation unit configured to calculate a first dimension error caused by a loading effect, using the first area density;
a first dimension calculation unit configured to calculate a second dimension of a pattern obtained by correcting the first dimension error of the first dimension;
a second area density calculation unit configured to calculate a second area density occupied by the pattern of the second dimension in the predetermined region;
a second dimension error calculation unit configured to calculate a second dimension error caused by the loading effect, using the second area density;
a second dimension calculation unit configured to calculate a third dimension by adding the second dimension error to the second dimension;
a judgment unit configured to judge whether a difference between the first dimension and the third dimension is within a predetermined range or not; and
an output unit configured to output the pattern of the second dimension in which the difference is within the predetermined range.

7. The apparatus according to claim 6 further comprising:
a third dimension calculation unit configured to calculate a fourth dimension, as a new second dimension, by adding the difference to the second dimension.

8. The apparatus according to claim 7, wherein the second area density calculation unit, the second dimension error calculation unit, and the second dimension calculation unit repeat each calculation until the difference is within the predetermined range.

9. A method for correcting a dimension error of a pattern comprising:
calculating, by using a computer, a first area density occupied by a pattern of a first dimension in a predetermined region;
calculating a first dimension error caused by a loading effect, using the first area density;
calculating a second dimension of a pattern obtained by correcting the first dimension error of the first dimension;
calculating a second area density occupied by the pattern of the second dimension in the predetermined region;
calculating a second dimension error caused by the loading effect, using the second area density;
calculating a third dimension by adding the second dimension error to the second dimension; and
judging whether a difference between the first dimension and the third dimension is within a predetermined range or not, to output the pattern of the second dimension when the difference is within the predetermined range.

10. The method according to claim 9 further comprising:
calculating a fourth dimension by adding the difference to the second dimension when the difference is out of the predetermined range;
calculating a third area density occupied by a pattern of the fourth dimension in the predetermined region;
calculating a third dimension error caused by the loading effect, using the third area density;
calculating a fifth dimension by adding the third dimension error to the fourth dimension; and
judging whether a second difference between the first dimension and the fifth dimension is within the predetermined range or not, to output the pattern of the fourth dimension when the second difference is within the predetermined range.

* * * * *